(12) United States Patent
Champlin (10) Patent No.: US 9,588,185 B2
(45) Date of Patent: Mar. 7, 2017

(54) METHOD AND APPARATUS FOR DETECTING CELL DETERIORATION IN AN ELECTROCHEMICAL CELL OR BATTERY

(76) Inventor: Keith S. Champlin, Minneapolis, MN (US)

( * ) Notice: Subject to any disclaimer, the term of this patent is extended or adjusted under 35 U.S.C. 154(b) by 785 days.

(21) Appl. No.: 12/712,456

(22) Filed: Feb. 25, 2010

(65) Prior Publication Data

US 2011/0208451 A1    Aug. 25, 2011

(51) Int. Cl.
*G01R 31/36*    (2006.01)

(52) U.S. Cl.
CPC ..... *G01R 31/3679* (2013.01); *G01R 31/3624* (2013.01); *G01R 31/3662* (2013.01)

(58) Field of Classification Search
CPC ............ G01R 31/3624; G01R 31/3662; G01R 31/3648; G01R 31/3679
USPC .......................................................... 702/63
See application file for complete search history.

(56) References Cited

U.S. PATENT DOCUMENTS

| | | | |
|---|---|---|---|
| 85,533 A | 1/1869 | Adams | 33/472 |
| 2,000,665 A | 5/1935 | Neal | 439/440 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |

(Continued)

FOREIGN PATENT DOCUMENTS

| CN | 2470964 Y | 1/2002 |
|---|---|---|
| CN | 201063352 Y | 5/2008 |

(Continued)

OTHER PUBLICATIONS

Search Report and Written Opinion from PCT Application No. PCT/US2011/026608, dated Aug. 29, 2011, 9 pgs.

(Continued)

*Primary Examiner* — Michael Nghiem
(74) *Attorney, Agent, or Firm* — Westman, Champlin & Koehler, P.A.

(57) ABSTRACT

A testing device contains measuring circuitry adapted to apply time-varying electrical excitation to a cell or battery, to sense a time-varying electrical response, and to thus determine components of complex immittance at n+m discrete frequencies, where n is an integer equal to or greater than two and m is an integer equal to or greater than one. Computation circuitry utilizes measured complex immittance components at the n discrete frequencies to evaluate the elements of a 2n-element equivalent circuit model. It then calculates the complex immittance of this model at the m discrete frequencies and mathematically compares components of the calculated immittances with components of the measured immittances at the m discrete frequencies. The results of this comparison establish the degree of cell deterioration without regard to the battery's manufacturer, group size, or its electrical ratings.

26 Claims, 2 Drawing Sheets

(56) References Cited

U.S. PATENT DOCUMENTS

| | | | |
|---|---|---|---|
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/430 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/334 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |

(56) References Cited

U.S. PATENT DOCUMENTS

| | | | |
|---|---|---|---|
| 5,160,881 A | 11/1992 | Schramm et al. ............... 322/7 |
| 5,164,653 A | 11/1992 | Reem |
| 5,168,208 A | 12/1992 | Schultz et al. ................. 322/25 |
| 5,170,124 A | 12/1992 | Blair et al. .................... 324/434 |
| 5,179,335 A | 1/1993 | Nor ................................ 320/159 |
| 5,187,382 A | 2/1993 | Kondo |
| 5,194,799 A | 3/1993 | Tomantschger ............. 320/103 |
| 5,204,611 A | 4/1993 | Nor et al. ...................... 320/145 |
| 5,214,370 A | 5/1993 | Harm et al. ................... 320/152 |
| 5,214,385 A | 5/1993 | Gabriel et al. ................ 324/434 |
| 5,223,747 A | 6/1993 | Tschulena .................... 257/713 |
| 5,241,275 A | 8/1993 | Fang ............................. 324/430 |
| 5,254,952 A | 10/1993 | Salley et al. ................. 324/429 |
| 5,266,880 A | 11/1993 | Newland ...................... 320/125 |
| 5,278,759 A | 1/1994 | Berra et al. ...................... 701/1 |
| 5,281,919 A | 1/1994 | Palanisamy .................. 324/427 |
| 5,281,920 A | 1/1994 | Wurst ........................... 324/430 |
| 5,295,078 A | 3/1994 | Stich et al. ................... 700/297 |
| 5,298,797 A | 3/1994 | Redl .............................. 327/387 |
| 5,300,874 A | 4/1994 | Shimamoto et al. ......... 320/106 |
| 5,302,902 A | 4/1994 | Groehl .......................... 324/434 |
| 5,309,052 A | 5/1994 | Kim ................................ 74/350 |
| 5,313,152 A | 5/1994 | Wozniak et al. ............. 320/118 |
| 5,315,287 A | 5/1994 | Sol ................................ 340/455 |
| 5,321,626 A | 6/1994 | Palladino ........................ 702/63 |
| 5,321,627 A | 6/1994 | Reher ............................. 702/63 |
| 5,323,337 A | 6/1994 | Wilson et al. .................. 702/73 |
| 5,325,041 A | 6/1994 | Briggs .......................... 320/149 |
| 5,331,268 A | 7/1994 | Patino et al. ................. 320/158 |
| 5,332,927 A | 7/1994 | Paul et al. ...................... 307/66 |
| 5,336,993 A | 8/1994 | Thomas et al. ............ 324/158.1 |
| 5,338,515 A | 8/1994 | Dalla Betta et al. ........... 422/95 |
| 5,339,018 A | 8/1994 | Brokaw ........................ 320/147 |
| 5,343,380 A | 8/1994 | Champlin ...................... 363/46 |
| 5,345,384 A | 9/1994 | Przybyla et al. ............. 701/29.1 |
| 5,347,163 A | 9/1994 | Yoshimura ..................... 307/66 |
| 5,349,535 A | 9/1994 | Gupta .......................... 320/106 |
| 5,352,968 A | 10/1994 | Reni et al. ................... 320/136 |
| 5,357,519 A | 10/1994 | Martin et al. ............... 371/15.1 |
| 5,365,160 A | 11/1994 | Leppo et al. ................ 320/106 |
| 5,365,453 A | 11/1994 | Startup et al. ................. 702/36 |
| 5,369,364 A | 11/1994 | Renirie et al. ............... 324/430 |
| 5,381,096 A | 1/1995 | Hirzel .......................... 324/427 |
| 5,384,540 A | 1/1995 | Dessel .......................... 324/539 |
| 5,387,871 A | 2/1995 | Tsai .............................. 324/429 |
| 5,394,093 A | 2/1995 | Cervas ......................... 324/556 |
| 5,402,007 A | 3/1995 | Center et al. ............... 290/40 B |
| 5,410,754 A | 4/1995 | Klotzbach et al. ........... 370/466 |
| 5,412,308 A | 5/1995 | Brown .......................... 323/267 |
| 5,412,323 A | 5/1995 | Kato et al. ................... 324/429 |
| 5,425,041 A | 6/1995 | Seko et al. ................. 372/45.01 |
| 5,426,371 A | 6/1995 | Salley et al. ................. 324/429 |
| 5,426,416 A | 6/1995 | Jefferies et al. ............. 340/664 |
| 5,430,645 A | 7/1995 | Keller ....................... 364/424.01 |
| 5,432,025 A | 7/1995 | Cox ................................ 29/65 |
| 5,432,426 A | 7/1995 | Yoshida ........................ 320/160 |
| 5,434,495 A | 7/1995 | Toko ............................. 320/135 |
| 5,435,185 A | 7/1995 | Eagan ............................ 73/587 |
| 5,442,274 A | 8/1995 | Tamai ........................... 320/146 |
| 5,445,026 A | 8/1995 | Eagan ............................ 73/591 |
| 5,449,996 A | 9/1995 | Matsumoto et al. ......... 320/148 |
| 5,449,997 A | 9/1995 | Gilmore et al. .............. 320/148 |
| 5,451,881 A | 9/1995 | Finger .......................... 324/433 |
| 5,453,027 A | 9/1995 | Buell et al. ................... 439/433 |
| 5,457,377 A | 10/1995 | Jonsson ........................ 324/430 |
| 5,459,660 A | 10/1995 | Berra ............................. 701/33 |
| 5,462,439 A | 10/1995 | Keith ........................... 180/279 |
| 5,469,043 A | 11/1995 | Cherng et al. ............... 320/161 |
| 5,485,090 A | 1/1996 | Stephens ...................... 324/433 |
| 5,488,300 A | 1/1996 | Jamieson ..................... 324/432 |
| 5,504,674 A | 4/1996 | Chen et al. ...................... 705/4 |
| 5,508,599 A | 4/1996 | Koenck ........................ 320/138 |
| 5,519,383 A | 5/1996 | De La Rosa ............. 340/636.15 |
| 5,528,148 A | 6/1996 | Rogers ......................... 320/137 |
| 5,537,967 A | 7/1996 | Tashiro et al. ............. 123/192.1 |
| 5,541,489 A | 7/1996 | Dunstan ....................... 320/134 |
| 5,546,317 A | 8/1996 | Andrieu .......................... 702/63 |
| 5,548,273 A | 8/1996 | Nicol et al. ................... 340/439 |
| 5,550,485 A | 8/1996 | Falk .............................. 324/772 |
| 5,561,380 A | 10/1996 | Sway-Tin et al. ............ 324/509 |
| 5,562,501 A | 10/1996 | Kinoshita et al. ............ 439/852 |
| 5,563,496 A | 10/1996 | McClure ....................... 320/128 |
| 5,572,136 A | 11/1996 | Champlin ..................... 324/426 |
| 5,573,611 A | 11/1996 | Koch et al. ................ 152/152.1 |
| 5,574,355 A | 11/1996 | McShane et al. ............ 320/161 |
| 5,578,915 A | 11/1996 | Crouch, Jr. et al. .......... 324/428 |
| 5,583,416 A | 12/1996 | Klang ........................... 320/160 |
| 5,585,416 A | 12/1996 | Audett et al. .................. 522/35 |
| 5,585,728 A | 12/1996 | Champlin ..................... 324/427 |
| 5,589,757 A | 12/1996 | Klang ........................... 320/160 |
| 5,592,093 A | 1/1997 | Klingbiel ...................... 324/426 |
| 5,592,094 A | 1/1997 | Ichikawa ...................... 324/427 |
| 5,596,260 A | 1/1997 | Moravec et al. ............. 320/135 |
| 5,596,261 A | 1/1997 | Suyama ........................ 320/152 |
| 5,598,098 A | 1/1997 | Champlin ..................... 324/430 |
| 5,602,462 A | 2/1997 | Stich et al. ................... 323/258 |
| 5,606,242 A | 2/1997 | Hull et al. .................... 320/106 |
| 5,614,788 A | 3/1997 | Mullins et al. ................. 315/82 |
| 5,621,298 A | 4/1997 | Harvey ......................... 320/134 |
| 5,631,536 A | 5/1997 | Tseng ............................. 320/15 |
| 5,631,831 A | 5/1997 | Bird et al. ................... 701/34.4 |
| 5,633,985 A | 5/1997 | Severson et al. ............. 704/267 |
| 5,637,978 A | 6/1997 | Kellett et al. ................. 320/104 |
| 5,642,031 A | 6/1997 | Brotto .......................... 320/156 |
| 5,644,212 A | 7/1997 | Takahashi |
| 5,650,937 A | 7/1997 | Bounaga ........................ 702/65 |
| 5,652,501 A | 7/1997 | McClure et al. ......... 340/636.15 |
| 5,653,659 A | 8/1997 | Kunibe et al. ................ 477/111 |
| 5,654,623 A | 8/1997 | Shiga et al. .................. 320/106 |
| 5,656,920 A | 8/1997 | Cherng et al. ............... 324/431 |
| 5,661,368 A | 8/1997 | Deol et al. ..................... 315/82 |
| 5,666,040 A | 9/1997 | Bourbeau ..................... 320/118 |
| 5,675,234 A | 10/1997 | Greene .................... 340/636.11 |
| 5,677,077 A | 10/1997 | Faulk ............................. 429/90 |
| 5,684,678 A | 11/1997 | Barrett .......................... 363/17 |
| 5,685,734 A | 11/1997 | Kutz ............................. 439/371 |
| 5,691,621 A | 11/1997 | Phuoc et al. ................. 320/134 |
| 5,699,050 A | 12/1997 | Kanazawa ............... 340/636.13 |
| 5,701,089 A | 12/1997 | Perkins ........................ 324/772 |
| 5,705,929 A | 1/1998 | Caravello et al. ............ 324/430 |
| 5,707,015 A | 1/1998 | Guthrie ........................ 241/120 |
| 5,710,503 A | 1/1998 | Sideris et al. ................ 320/116 |
| 5,711,648 A | 1/1998 | Hammerslag ................ 414/800 |
| 5,712,795 A | 1/1998 | Layman et al. .............. 700/297 |
| 5,717,336 A | 2/1998 | Basell et al. ................. 324/430 |
| 5,717,937 A | 2/1998 | Fritz ............................. 713/300 |
| 5,721,688 A | 2/1998 | Bramwell ..................... 324/426 |
| 5,732,074 A | 3/1998 | Spaur et al. .................. 370/313 |
| 5,739,667 A | 4/1998 | Matsuda et al. .............. 320/128 |
| 5,744,962 A | 4/1998 | Alber et al. .................. 324/426 |
| 5,745,044 A | 4/1998 | Hyatt, Jr. et al. ............. 340/5.23 |
| 5,747,189 A | 5/1998 | Perkins .......................... 429/91 |
| 5,747,909 A | 5/1998 | Syverson et al. ......... 310/156.56 |
| 5,747,967 A | 5/1998 | Muljadi et al. ............... 320/148 |
| 5,754,417 A | 5/1998 | Nicollini ........................ 363/60 |
| 5,757,192 A | 5/1998 | McShane et al. ............ 324/427 |
| 5,760,587 A | 6/1998 | Harvey ......................... 324/434 |
| 5,772,468 A | 6/1998 | Kowalski et al. ............ 439/506 |
| 5,773,962 A | 6/1998 | Nor ................................ 20/134 |
| 5,773,978 A | 6/1998 | Becker ......................... 324/430 |
| 5,778,326 A | 7/1998 | Moroto et al. .................. 701/22 |
| 5,780,974 A | 7/1998 | Pabla et al. .................... 315/82 |
| 5,780,980 A | 7/1998 | Naito ............................ 318/139 |
| 5,789,899 A | 8/1998 | van Phuoc et al. ........... 320/112 |
| 5,793,359 A | 8/1998 | Ushikubo ..................... 345/169 |
| 5,796,239 A | 8/1998 | van Phuoc et al. .......... 320/107 |
| 5,808,469 A | 9/1998 | Kopera ......................... 324/434 |
| 5,811,979 A | 9/1998 | Rhein ........................... 324/718 |
| 5,818,201 A | 10/1998 | Stockstad et al. ............ 320/119 |
| 5,818,234 A | 10/1998 | McKinnon ................... 324/433 |
| 5,820,407 A | 10/1998 | Morse et al. ................. 439/504 |
| 5,821,756 A | 10/1998 | McShane et al. ............ 324/430 |
| 5,821,757 A | 10/1998 | Alvarez et al. ............... 324/434 |
| 5,825,174 A | 10/1998 | Parker .......................... 324/106 |

(56) References Cited

U.S. PATENT DOCUMENTS

| | | |
|---|---|---|
| 5,831,435 A | 11/1998 | Troy .......................... 324/426 |
| 5,832,396 A | 11/1998 | Moroto et al. ................. 701/22 |
| 5,850,113 A | 12/1998 | Weimer et al. ............... 307/125 |
| 5,862,515 A | 1/1999 | Kobayashi et al. ............ 702/63 |
| 5,865,638 A | 2/1999 | Trafton ........................ 439/288 |
| 5,869,951 A | 2/1999 | Takahashi ................... 320/104 |
| 5,870,018 A | 2/1999 | Person ........................ 307/10.2 |
| 5,871,858 A | 2/1999 | Thomsen et al. ................ 429/7 |
| 5,872,443 A | 2/1999 | Williamson ................. 320/160 |
| 5,872,453 A | 2/1999 | Shimoyama et al. ........ 324/431 |
| 5,883,306 A | 3/1999 | Hwang ....................... 73/146.8 |
| 5,884,202 A | 3/1999 | Arjomand ................... 701/31.4 |
| 5,895,440 A | 4/1999 | Proctor et al. ................. 702/63 |
| 5,903,154 A | 5/1999 | Zhang et al. ................. 324/437 |
| 5,903,716 A | 5/1999 | Kimber et al. ............... 395/114 |
| 5,912,534 A | 6/1999 | Benedict ........................ 315/82 |
| 5,914,605 A | 6/1999 | Bertness ...................... 324/426 |
| 5,916,287 A | 6/1999 | Arjomand et al. .......... 701/33.2 |
| 5,927,938 A | 7/1999 | Hammerslag ................ 414/809 |
| 5,929,609 A | 7/1999 | Joy et al. ........................ 322/25 |
| 5,935,180 A | 8/1999 | Fieramosca et al. ........ 701/29.6 |
| 5,939,855 A | 8/1999 | Proctor et al. ............... 320/104 |
| 5,939,861 A | 8/1999 | Joko et al. ................... 320/122 |
| 5,945,829 A | 8/1999 | Bertness ...................... 324/430 |
| 5,946,605 A | 8/1999 | Takahisa et al. ............... 455/68 |
| 5,950,144 A | 9/1999 | Hall et al. .................... 702/108 |
| 5,951,229 A | 9/1999 | Hammerslag ................ 414/398 |
| 5,953,322 A | 9/1999 | Kimball ....................... 370/328 |
| 5,955,951 A | 9/1999 | Wischerop et al. ........ 340/572.8 |
| 5,961,561 A | 10/1999 | Wakefield, II ................. 701/29 |
| 5,961,604 A | 10/1999 | Anderson et al. ............ 709/229 |
| 5,963,012 A | 10/1999 | Garcia et al. ................. 320/106 |
| 5,969,625 A | 10/1999 | Russo ..................... 340/636.19 |
| 5,973,598 A | 10/1999 | Beigel ........................ 340/572.1 |
| 5,978,805 A | 11/1999 | Carson .......................... 707/10 |
| 5,982,138 A | 11/1999 | Krieger ....................... 320/105 |
| 5,990,664 A | 11/1999 | Rahman ...................... 320/136 |
| 6,002,238 A | 12/1999 | Champlin .................... 320/134 |
| 6,005,489 A | 12/1999 | Siegle et al. ............. 340/825.69 |
| 6,005,759 A | 12/1999 | Hart et al. ..................... 361/66 |
| 6,008,652 A | 12/1999 | Theofanopoulos et al. .. 324/434 |
| 6,009,369 A | 12/1999 | Boisvert et al. ................ 701/99 |
| 6,016,047 A | 1/2000 | Notten et al. ................ 320/137 |
| 6,031,354 A | 2/2000 | Wiley et al. ................. 320/116 |
| 6,031,368 A | 2/2000 | Klippel et al. ............... 324/133 |
| 6,037,745 A | 3/2000 | Koike et al. ................. 320/104 |
| 6,037,749 A | 3/2000 | Parsonage ................... 320/132 |
| 6,037,751 A | 3/2000 | Klang .......................... 320/160 |
| 6,037,777 A | 3/2000 | Champlin .................... 324/430 |
| 6,037,778 A | 3/2000 | Makhija ....................... 324/433 |
| 6,046,514 A | 4/2000 | Rouillard et al. .............. 307/77 |
| 6,051,976 A | 4/2000 | Bertness ...................... 324/426 |
| 6,055,468 A | 4/2000 | Kaman et al. .................. 701/29 |
| 6,061,638 A | 5/2000 | Joyce ............................. 702/63 |
| 6,064,372 A | 5/2000 | Kahkoska .................... 345/173 |
| 6,072,299 A | 6/2000 | Kurle et al. .................. 320/112 |
| 6,072,300 A | 6/2000 | Tsuji ............................ 320/116 |
| 6,075,339 A | 6/2000 | Reipur et al. ................. 320/110 |
| 6,081,098 A | 6/2000 | Bertness et al. .............. 320/134 |
| 6,081,109 A | 6/2000 | Seymour et al. ............. 324/127 |
| 6,081,154 A | 6/2000 | Ezell et al. ................... 327/540 |
| 6,087,815 A | 7/2000 | Pfeifer et al. ................ 323/282 |
| 6,091,238 A | 7/2000 | McDermott ............... 324/207.2 |
| 6,091,245 A | 7/2000 | Bertness ...................... 324/426 |
| 6,094,033 A | 7/2000 | Ding et al. ................... 320/132 |
| 6,097,193 A | 8/2000 | Bramwell .................... 324/429 |
| 6,100,670 A | 8/2000 | Levesque ..................... 320/150 |
| 6,100,815 A | 8/2000 | Pailthorp ................. 324/754.07 |
| 6,104,167 A | 8/2000 | Bertness et al. .............. 320/132 |
| 6,113,262 A | 9/2000 | Purola et al. ................... 374/45 |
| 6,114,834 A | 9/2000 | Parise .......................... 320/109 |
| 6,121,880 A | 9/2000 | Scott et al. ................ 340/572.5 |
| 6,136,914 A | 10/2000 | Hergenrother et al. ...... 524/495 |
| 6,137,269 A | 10/2000 | Champlin .................... 320/150 |
| 6,140,797 A | 10/2000 | Dunn ........................... 320/105 |
| 6,141,608 A | 10/2000 | Rother ........................ 701/29.6 |
| 6,144,185 A | 11/2000 | Dougherty et al. ........... 320/132 |
| 6,147,598 A | 11/2000 | Murphy et al. .......... 340/426.19 |
| 6,150,793 A | 11/2000 | Lesesky et al. .............. 320/104 |
| 6,158,000 A | 12/2000 | Collins ........................... 713/1 |
| 6,161,640 A | 12/2000 | Yamaguchi .................. 180/65.8 |
| 6,163,156 A | 12/2000 | Bertness ...................... 324/426 |
| 6,164,063 A | 12/2000 | Mendler ......................... 60/274 |
| 6,167,349 A | 12/2000 | Alvarez ......................... 702/63 |
| 6,172,483 B1 | 1/2001 | Champlin .................... 320/134 |
| 6,172,505 B1 | 1/2001 | Bertness ...................... 324/430 |
| 6,177,737 B1 | 1/2001 | Palfey et al. .................. 307/64 |
| 6,181,545 B1 | 1/2001 | Amatucci et al. ............ 361/502 |
| 6,184,656 B1 | 2/2001 | Karunasiri et al. ........... 320/119 |
| 6,191,557 B1 | 2/2001 | Parsonage ................... 320/132 |
| 6,202,739 B1 | 3/2001 | Pal et al. .................. 165/104.33 |
| 6,211,651 B1 | 4/2001 | Nemoto ....................... 320/133 |
| 6,211,653 B1 | 4/2001 | Gray et al. ................... 320/132 |
| 6,215,275 B1 | 4/2001 | Bean ............................ 320/106 |
| 6,218,805 B1 | 4/2001 | Melcher ....................... 320/105 |
| 6,218,936 B1 | 4/2001 | Imao ............................ 340/447 |
| 6,222,342 B1 | 4/2001 | Eggert et al. ................ 320/105 |
| 6,222,369 B1 | 4/2001 | Champlin .................... 324/430 |
| D442,503 S | 5/2001 | Lundbeck et al. ............. D10/77 |
| 6,225,808 B1 | 5/2001 | Varghese et al. ............ 324/426 |
| 6,225,898 B1 | 5/2001 | Kamiya et al. .............. 340/505 |
| 6,236,186 B1 | 5/2001 | Helton et al. ................ 320/106 |
| 6,236,332 B1 | 5/2001 | Conkright et al. ............ 340/3.1 |
| 6,236,949 B1 | 5/2001 | Hart .............................. 702/64 |
| 6,238,253 B1 | 5/2001 | Qualls ......................... 439/759 |
| 6,242,887 B1 | 6/2001 | Burke .......................... 320/104 |
| 6,249,124 B1 | 6/2001 | Bertness ...................... 324/426 |
| 6,250,973 B1 | 6/2001 | Lowery et al. ............... 439/763 |
| 6,254,438 B1 | 7/2001 | Gaunt .......................... 439/755 |
| 6,255,826 B1 | 7/2001 | Ohsawa ....................... 320/116 |
| 6,259,170 B1 | 7/2001 | Limoge et al. ............. 307/10.8 |
| 6,259,254 B1 | 7/2001 | Klang .......................... 324/427 |
| 6,262,563 B1 | 7/2001 | Champlin .................... 320/134 |
| 6,262,692 B1 | 7/2001 | Babb ............................ 343/895 |
| 6,263,268 B1 | 7/2001 | Nathanson .................... 701/29 |
| 6,263,322 B1 | 7/2001 | Kirkevold et al. ........... 705/400 |
| 6,271,643 B1 | 8/2001 | Becker et al. ................ 320/112 |
| 6,271,748 B1 | 8/2001 | Derbyshire et al. .......... 340/442 |
| 6,272,387 B1 | 8/2001 | Yoon .............................. 700/83 |
| 6,275,008 B1 | 8/2001 | Arai et al. .................... 320/132 |
| 6,285,191 B1 | 9/2001 | Gollomp et al. ............. 324/427 |
| 6,294,896 B1 | 9/2001 | Champlin .................... 320/134 |
| 6,294,897 B1 | 9/2001 | Champlin .................... 320/153 |
| 6,304,087 B1 | 10/2001 | Bertness ...................... 324/426 |
| 6,307,349 B1 | 10/2001 | Koenck et al. ............... 320/112 |
| 6,310,481 B2 | 10/2001 | Bertness ...................... 324/430 |
| 6,313,607 B1 | 11/2001 | Champlin .................... 320/132 |
| 6,313,608 B1 | 11/2001 | Varghese et al. ............ 320/132 |
| 6,316,914 B1 | 11/2001 | Bertness ...................... 320/134 |
| 6,320,351 B1 | 11/2001 | Ng et al. ...................... 320/104 |
| 6,323,650 B1 | 11/2001 | Bertness et al. .............. 324/426 |
| 6,324,042 B1 | 11/2001 | Andrews .................... 361/93.2 |
| 6,329,793 B1 | 12/2001 | Bertness et al. .............. 320/132 |
| 6,331,762 B1 | 12/2001 | Bertness ...................... 320/134 |
| 6,332,113 B1 | 12/2001 | Bertness ........................ 702/63 |
| 6,346,795 B2 | 2/2002 | Haraguchi et al. ........... 320/136 |
| 6,347,958 B1 | 2/2002 | Tsai ............................. 439/488 |
| 6,351,102 B1 | 2/2002 | Troy ............................ 320/139 |
| 6,356,042 B1 | 3/2002 | Kahlon et al. ............... 318/138 |
| 6,356,083 B1 | 3/2002 | Ying ............................ 324/426 |
| 6,359,441 B1 | 3/2002 | Bertness ...................... 324/426 |
| 6,359,442 B1 | 3/2002 | Henningson et al. ........ 324/426 |
| 6,363,303 B1 | 3/2002 | Bertness ........................ 701/29 |
| RE37,677 E | 4/2002 | Irie ............................... 315/83 |
| 6,377,031 B1 | 4/2002 | Karuppana et al. .......... 323/220 |
| 6,384,608 B1 | 5/2002 | Namaky ....................... 324/430 |
| 6,388,448 B1 | 5/2002 | Cervas ......................... 324/426 |
| 6,389,337 B1 | 5/2002 | Kolls .......................... 701/31.6 |
| 6,392,414 B2 | 5/2002 | Bertness ...................... 324/429 |
| 6,396,278 B1 | 5/2002 | Makhija ....................... 324/402 |
| 6,407,554 B1 | 6/2002 | Godau et al. ................. 324/503 |
| 6,411,098 B1 | 6/2002 | Laletin ......................... 324/436 |
| 6,417,669 B1 | 7/2002 | Champlin .................... 324/426 |
| 6,420,852 B1 | 7/2002 | Sato ............................. 320/134 |

(56) References Cited

U.S. PATENT DOCUMENTS

| | | | |
|---|---|---|---|
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 24/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,988,053 B2 | 1/2006 | Namaky | 320/104 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,049,822 B2 | 5/2006 | Kung | 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 | 2/2007 | Katsuyama | 174/36 |
| 7,177,925 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |

(56) References Cited

U.S. PATENT DOCUMENTS

| | | | |
|---|---|---|---|
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 20/116 |
| 7,684,908 B1 | 3/2010 | Ogilvie et al. | 701/29.6 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,743,788 B2 | 6/2010 | Schmitt | 137/554 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,924,015 B2 | 4/2011 | Bertness | 324/427 |
| 7,940,053 B2 | 5/2011 | Brown et al. | 324/426 |
| 7,990,155 B2 | 8/2011 | Henningson | 324/429 |
| 7,999,505 B2 | 8/2011 | Bertness | 320/104 |
| 8,024,083 B2 | 9/2011 | Chenn | 701/2 |
| 8,164,343 B2 | 4/2012 | Bertness | 324/503 |
| 8,222,868 B2 | 7/2012 | Buckner | 320/136 |
| 8,306,690 B2 | 11/2012 | Bertness | 701/34.4 |
| 8,449,560 B2 | 5/2013 | Roth | 227/175.1 |
| 8,594,957 B2 | 11/2013 | Gauthier | 324/548 |
| 8,827,729 B2 | 9/2014 | Gunreben | 439/188 |
| 9,037,394 B2 | 5/2015 | Fernandes | 701/400 |
| 2001/0012738 A1 | 8/2001 | Duperret | 439/835 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0074398 A1 | 6/2002 | Lancos et al. | 235/382 |
| 2002/0109504 A1* | 8/2002 | Champlin | 324/426 |
| 2002/0116140 A1 | 8/2002 | Rider | 702/63 |
| 2002/0118111 A1 | 8/2002 | Brown et al. | 340/573.1 |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0171428 A1 | 11/2002 | Bertness | 702/63 |
| 2002/0176010 A1 | 11/2002 | Wallach et al. | 348/362 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0177417 A1 | 9/2003 | Malhotra et al. | 714/42 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/183 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness | 320/136 |
| 2004/0257084 A1 | 12/2004 | Restaino | 324/400 |
| 2005/0007068 A1 | 1/2005 | Johnson et al. | 320/110 |
| 2005/0009122 A1 | 1/2005 | Whelan et al. | 435/7.32 |
| 2005/0017726 A1 | 1/2005 | Koran et al. | 324/433 |
| 2005/0017952 A1 | 1/2005 | His | 345/169 |
| 2005/0021197 A1 | 1/2005 | Zimmerman | 701/31.4 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1 | 4/2005 | Gross | 725/107 |
| 2005/0096809 A1 | 5/2005 | Skeen et al. | 701/29 |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |

(56) References Cited

U.S. PATENT DOCUMENTS

| | | | |
|---|---|---|---|
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |
| 2005/0143882 A1 | 6/2005 | Umezawa | 701/29 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0212521 A1 | 9/2005 | Bertness et al. | 324/426 |
| 2005/0213874 A1 | 9/2005 | Kline | 385/15 |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2005/0269880 A1 | 12/2005 | Konishi | 307/10.7 |
| 2005/0273218 A1 | 12/2005 | Breed | 701/2 |
| 2006/0012330 A1 | 1/2006 | Okumura et al. | 320/103 |
| 2006/0017447 A1 | 1/2006 | Bertness | 324/538 |
| 2006/0026017 A1 | 2/2006 | Walkder | 701/31.4 |
| 2006/0030980 A1 | 2/2006 | St. Denis | 701/29 |
| 2006/0043976 A1 | 3/2006 | Gervais | 324/508 |
| 2006/0079203 A1 | 4/2006 | Nicolini | 455/411 |
| 2006/0089767 A1 | 4/2006 | Sowa | 701/29 |
| 2006/0095230 A1 | 5/2006 | Grier et al. | 702/183 |
| 2006/0102397 A1 | 5/2006 | Buck | 429/432 |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244457 A1 | 11/2006 | Henningson et al. | 324/426 |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0088472 A1 | 4/2007 | Ganzhorn et al. | 701/33 |
| 2007/0108942 A1 | 5/2007 | Johnson et al. | 320/112 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205983 A1 | 9/2007 | Naimo | 345/160 |
| 2007/0259256 A1* | 11/2007 | Le Canut et al. | 429/90 |
| 2008/0036421 A1 | 2/2008 | Seo | 320/132 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0094068 A1 | 4/2008 | Scott | 324/426 |
| 2008/0103656 A1 | 5/2008 | Lipscomb | 701/33.4 |
| 2008/0169818 A1 | 7/2008 | Lesesky et al. | 324/426 |
| 2008/0179122 A1 | 7/2008 | Sugawara | 180/65.245 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146800 A1 | 6/2009 | Grimlund et al. | 340/505 |
| 2009/0198372 A1 | 8/2009 | Hammerslag | 700/226 |
| 2009/0203247 A1 | 8/2009 | Fifelski | 439/345 |
| 2009/0247020 A1 | 10/2009 | Gathman et al. | 439/759 |
| 2009/0265121 A1 | 10/2009 | Rocci | 702/57 |
| 2009/0276115 A1 | 11/2009 | Chen | 701/32 |
| 2010/0023198 A1 | 1/2010 | Hamilton | 701/29 |
| 2010/0066283 A1 | 3/2010 | Kitanaka | 318/400.02 |
| 2010/0145780 A1 | 6/2010 | Nishikawa et al. | 705/14.11 |
| 2010/0214055 A1 | 8/2010 | Fuji | 340/3.1 |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0215767 A1 | 9/2011 | Johnson et al. | 320/136 |
| 2011/0273181 A1 | 11/2011 | Park et al. | 324/429 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0116391 A1 | 5/2012 | Houser | 606/41 |
| 2012/0249069 A1 | 10/2012 | Ohtomo | 320/109 |
| 2012/0256494 A1 | 10/2012 | Kesler | 307/104 |
| 2012/0256568 A1 | 10/2012 | Lee | 318/139 |
| 2013/0158782 A1 | 6/2013 | Bertness et al. | 701/34.4 |
| 2013/0311124 A1 | 11/2013 | Van Bremen | 702/104 |
| 2014/0002094 A1 | 1/2014 | Champlin | 324/426 |

FOREIGN PATENT DOCUMENTS

| | | |
|---|---|---|
| DE | 29 26 716 B1 | 1/1981 |
| DE | 196 38 324 | 9/1996 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 | 7/2007 |
| EP | 1 807 710 | 1/2010 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001057711 A | 2/2001 |
| JP | 2003-346909 | 12/2003 |
| JP | 2006331976 A | 12/2006 |
| JP | 2009-244166 | 10/2009 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |

(56) References Cited

FOREIGN PATENT DOCUMENTS

| WO | WO 01/51947 | | 7/2001 |
|---|---|---|---|
| WO | WO 03/047064 A3 | | 6/2003 |
| WO | WO 03/076960 A1 | | 9/2003 |
| WO | WO 2004/047215 A1 | | 6/2004 |
| WO | WO 2009/004001 | * | 1/2009 |
| WO | WO 2010/007681 | | 1/2010 |
| WO | WO 2011/153419 | | 12/2011 |
| WO | WO 2012/078921 | | 6/2012 |

OTHER PUBLICATIONS

Search Report and Written Opinion from PCT Application No. PCT/US2011/038279, dated Sep. 16, 2011, 12 pgs.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-4$^{th}$—Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_de-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.
"Notification of Transmittal of The International Search Report or the Declaration", PCT/US02/29461.
"Notification of Transmittal of the International Search Report or the Declaration", PCT/US03/07546.

"Notification of Transmittal of The International Search Report or the Declaration", PCT/US03/06577.
"Notification of Transmittal of The International Search Report or the Declaration", PCT/US03/07837.
"Improved Impedance Spectroscopy Technique for Status Determination of Production Li/SO$_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the UK Patent Office for App. No. 0417678.0; Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
Office Action from U.S. Appl. No. 11/352,945; dated Jan. 5, 2007.
Office Action from U.S. Appl. No. 11/146,608 dated May 13, 2008.
Office Action from U.S. Appl. No. 11/063,247 dated Apr. 11, 2008.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"Notification Concerning Availability of the Publication of the International Application" for PCT/US2008/008702, filed Jul. 17, 2008; 24 pages.
"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.
"First Notice Informing the Applicant of the Communication of the International Application (To Designated Offices which do not apply the 30 Month Time Limit Under Article 22(1))" for PCT/US2008/008702 filed Jul. 17, 2008; one page.
"Notification of the Recording of a Change" for PCT/US2008/008702 filed Jul. 17, 2008; one page.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead-Acid Batteries: Part I—Conductance/Capacity Correlation Studies", by D. Feder et al., Oct. 1992, pp. 1-15; (19 total pgs.).

(56) References Cited

OTHER PUBLICATIONS

"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
"Field Evaluation of Honda's EV PLUS Battery Packs", by A. Paryani, *IEEE AES Systems Magazine*, Nov. 2000, pp. 21-24.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.

* cited by examiner

Fig. 7

New Group-24 12-V Battery

×× Measurement
○○ Model Calculation Frequencies
+++ Model Results

Fig. 8

New Group-24 12-V Battery

Fig. 9

5-Yr Old Group-70 12-V Battery

××× Measurements
○○ Model Calculation Frequencies
+++ Model Results

Fig. 10

5-Yr Old Group-70 12-V Battery

METHOD AND APPARATUS FOR DETECTING CELL DETERIORATION IN AN ELECTROCHEMICAL CELL OR BATTERY

BACKGROUND OF THE INVENTION

Batteries comprising a plurality of series-connected electrochemical cells are ubiquitous in transportation and industrial applications. Six-cell lead-acid batteries are commonly used for engine starting and energy storage in conventional automobiles and trucks and for energy storage in standby applications. Batteries comprising larger arrays of lithium-ion and nickel-metal-hydride cells are becoming increasingly common in hybrid and all-electric vehicles. With all such batteries, the cells have maximum capability and their properties are relatively uniformly distributed over the battery when the battery is new. As the battery ages, however, the cells deteriorate and their properties become more nonuniformly distributed. The challenge is to detect and quantify such deterioration in order to ascertain when the battery should be replaced.

In the past, lead-acid batteries always had filler caps making the electrolytes of the individual cells accessible. A strategy for detecting cell deterioration in such batteries employed a hydrometer to observe the distribution of the specific gravity values among the cells. A distribution that was sufficiently nonuniform identified a battery that should be replaced. For example, the following information can be found on the Interstate Battery website: "Check each individual battery cell. If the specific gravity varies more than 0.050 or "50 points" among the cells while the battery is at a 75% state of charge or above, then the battery is bad and should be replaced." Unfortunately, this strategy has little value today since cell electrolytes are never accessible in AGM batteries and often not even accessible in flooded batteries.

Another earlier strategy for detecting a nonuniform distribution of cell properties was popular when the battery's inter-cell connectors were exposed. With such batteries, one could measure and compare the individual cell voltages. Cell voltages that deviated sufficiently from the average value identified a battery that should be replaced. Passing current through the battery while observing cell voltages enhanced the effect. Today, however, inter-cell connectors are not exposed, thus rendering this strategy also of little value.

Clearly, a method and apparatus that detects and quantifies cell deterioration in batteries for which neither cell electrolytes nor cell voltages are available would be desirable. The present invention addresses this need. It is based upon the important discovery that a well-known electrical circuit model best describes the battery's immittance characteristics (i.e., impedance or admittance characteristics) when the battery is new and all of its cells have nearly identical electrical properties. As the battery ages, cell deterioration sets in causing the cells' electrical properties to deviate from the norm and from one another. This deterioration can be detected and quantified by observing how well the circuit model actually "fits" the deteriorated battery. That is, how well the model predicts the battery's actual immittance at a particular measurement frequency. One advantage of this technique is that a pass/fail determination can be made without needing to know the battery's manufacturer, group size, or its electrical ratings.

SUMMARY OF THE INVENTION

A testing device detects and quantifies cell deterioration of an electrochemical cell or battery. The device contains measuring circuitry adapted to apply time-varying electrical excitation to said cell or battery, to sense time-varying electrical response to said excitation, and to utilize said excitation and response to determine components of complex immittance (i.e., either impedance or admittance) at n+m discrete frequencies, where n is an integer equal to or greater than two and m is an integer equal to or greater than one. Computation circuitry utilizes measured complex immittance components at the n discrete frequencies to evaluate the elements of a 2n-element equivalent circuit model. It then calculates the complex immittance of this model at the m discrete frequencies and mathematically compares components of the calculated immittances with components of the measured immittances at the m discrete frequencies. The results of this comparison are related to the degree of cell deterioration. A pass/fail determination can thus be made based solely upon cell deterioration—without even knowing the battery's manufacturer, group size, or its electrical ratings.

DETAILED DESCRIPTION OF THE PREFERRED EMBODIMENTS

Figure 1:
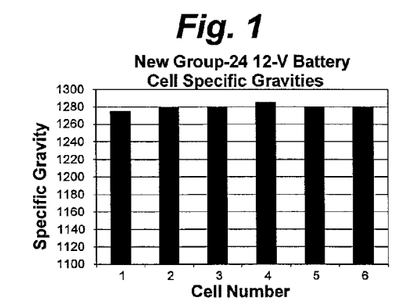
FIG. 1 is a bar graph depicting the electrolyte specific gravities of the individual cells of a new Group-24 12-volt automotive battery that is fully charged.

FIG. 1 is a bar graph disclosing specific gravities of the individual cells of a battery having very little cell deterioration. This battery is a brand-new Exide Dura-Start Group-24 12-volt automotive battery rated 525 CCA. It was fully charged. This battery possessed filler caps, so the cell electrolytes were readily accessible. One sees that the maximum gravity difference occurred between cells 1 and 4 and was only 10 points. That is well within the 50 point criterion allowed by the testing procedure described above. Thus, this battery would be considered "good" and could be returned to service.

Figure 2:
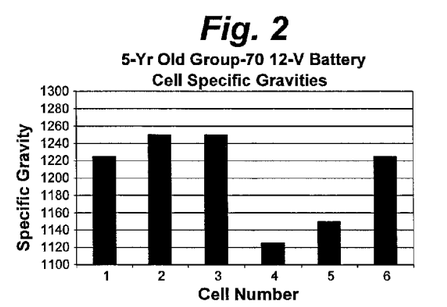
FIG. 2 is a bar graph depicting the electrolyte specific gravities of the individual cells of a 5-year old Group-70 12-volt automotive battery that is fully charged.

FIG. 2 is a bar graph disclosing specific gravities of the individual cells of a battery having cell deterioration. This battery is a 5-year old AC Delco Group-70 12-volt automotive battery rated 770 CCA. It too was fully charged. Since this battery did not have filler caps, it was necessary to physically cut the top off of the battery to gain access to the electrolytes. One sees a maximum gravity difference of 125 points between either cell 2 or cell 3 and cell 4. This result is outside of the 50 point criterion permitted by the testing procedure described above. Furthermore, cell 5 deviated by 100 points from either cell 2 or cell 3 and was therefore also out of tolerance. Thus, on the basis of cell deterioration, this battery should be removed from service.

Figure 3:
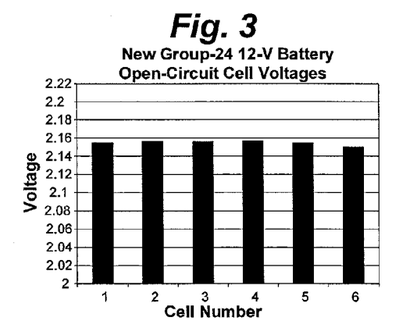
FIG. 3 is a bar graph depicting the open-circuit voltages of the individual cells of the fully-charged new Group-24 12-volt automotive battery.
Figure 4:
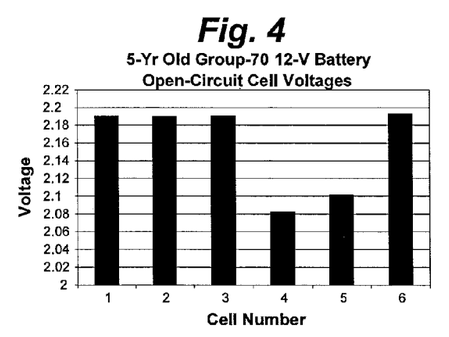
FIG. 4 is a bar graph depicting the open-circuit voltages of the individual cells of the fully-charged 5-year old Group-70 12-volt automotive battery.

FIGS. 3 and 4 are bar graphs showing the open-circuit cell voltages for these same two batteries measured at the inter-cell connectors. In order to gain access to these connectors on the new Group-24 battery, it was necessary to cut the top off of this battery as well. FIG. 3 shows that the maximum voltage difference between cells of the new battery occurred between cells 4 and 6 and was only 0.0066 volts. On the other hand, the 5-year old battery had differences of 0.1099 volts between cells 4 and 6, and of 0.0909 volts between cells 5 and 6. These results are completely consistent with the specific gravity differences disclosed in FIGS. 1 and 2 and again illustrate cell deterioration in the 5-year old battery—but not in the new battery.

The data disclosed in FIGS. 1 through 4 are very revealing vis-à-vis cell deterioration. Unfortunately, most of these data would be unavailable to an investigator interested in field-testing batteries.

Figure 5:
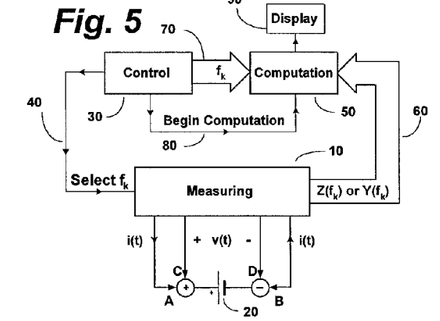
FIG. 5 is a block diagram of a device for detecting and quantifying cell deterioration in an electrochemical cell or battery according to the present invention.

FIG. 5 discloses a block diagram of apparatus for detecting and quantifying cell deterioration without requiring access to cell electrolytes or inter-cell connectors. It is based upon techniques disclosed previously in U.S. Pat. Nos. 6,002,238, 6,172,483, 6,262,563, 6,294,896, 6,037,777, and 6,222,369. An example of measuring circuitry 10 is disclosed, for example, in U.S. Pat. No. 6,172,483 in FIGS. 7, 8, and 9, and in the discussion beginning on line 63 of column 9 and ending on line 2 of column 12. An example of computation circuitry 50 is disclosed, for example, in U.S. Pat. No. 6,222,369 in FIGS. 7 and 8, and in the discussion beginning on line 31 of column 10 and ending on line 20 of column 11. Measuring circuitry 10 electrically couples to cell/battery 20 by means of current-carrying contacts A and B and voltage-sensing contacts C and D. Measuring circuitry 10 passes a periodic time-varying current i(t) through contacts A and B and senses a periodic time-varying voltage v(t) across contacts C and D. By appropriately processing and combining i(t) and v(t), measuring circuitry 10 determines real and imaginary parts of complex immittance, either impedance Z or admittance Y, at a measuring frequency $f_k$; where $f_k$ is a discrete frequency contained in the periodic waveforms of both i(t) and v(t).

Control circuitry 30 couples to measuring circuitry 10 via command path 40 and commands measuring circuitry 10 to determine the complex immittance of cell/battery 20 at each one of n+m discrete measuring frequencies, where n is an integer number equal to or greater than two and m is an integer number equal to or greater than one. This action defines 3(n+m) experimental quantities: the values of the n+m measuring frequencies and the values of the n+m imaginary parts and n+m real parts of the complex parameter at the n+m measuring frequencies.

Figure 6A:
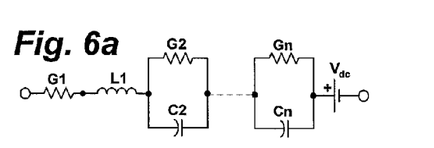
FIG. 6a depicts a general 2n-element equivalent circuit model of an electrochemical cell or battery.
Figure 6B:
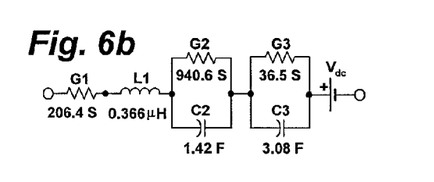
FIG. 6b depicts a six-element (n=3) equivalent circuit representation of the new fully-charged Group-24 12-volt automotive storage battery.

Computation circuitry 50 couples to measuring circuitry 10 and to control circuitry 30 via data paths 60 and 70, respectively, and accepts the 2(n+m) experimental values from measuring circuitry 10 and the values of the n+m measuring frequencies from control circuitry 30. Upon a "Begin Computation" command from control circuitry 30 via command path 80, computation circuitry 50 uses algorithms disclosed in U. S. Pat. Nos. 6,037,777 and 6,222,369 to combine these 3n quantities numerically to evaluate the 2n elements of an equivalent circuit model of the cell/battery (FIG. 6a). Computation circuitry 50 then calculates the complex immittance of this model at the m discrete measurement frequencies and mathematically compares components of these calculated immittances with components of the measured immittances at the m discrete frequencies. Cell deterioration is identified by the results of this comparison. If desired, computation circuitry 50 can make a pass/fail determination and can output this comparison result to the user on display 90. In practice, a microprocessor or microcontroller running an appropriate software program can perform the functions of both control circuitry 30 and computation circuitry 50. FIG. 6b discloses a six-element equivalent circuit model of the new fully-charged Group-24 automotive battery depicted in FIGS. 1 and 3. This circuit model was evaluated using apparatus of the type disclosed in FIG. 5 with n=3. The three measurement frequencies were 5 Hz, 80 Hz, and 1000 Hz.

Figure 7:
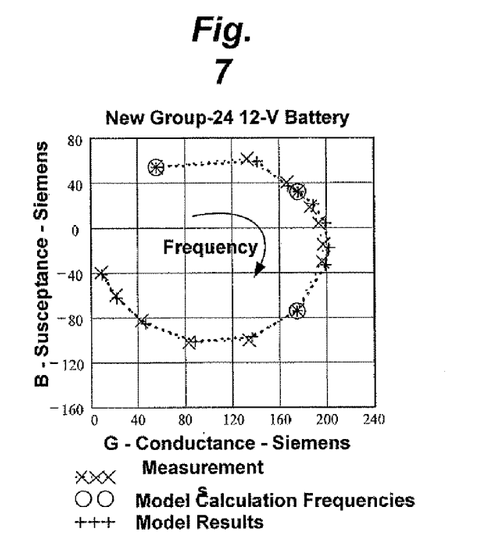
FIG. 7 is a Nyquist plot representation of the complex admittance of the new fully-charged Group-24 12-volt automotive storage battery modeled in FIG. 6b. Both measured and model-derived admittance values are plotted. The circled data points identify the three frequencies (5, 80, 1000 Hz) used for model evaluation.

FIG. 7 shows a Nyquist admittance plot for the battery whose model is depicted in FIG. 6b at 14 discrete measurement frequencies (n+m=14) ranging from 5 Hz to 10,000 Hz. Admittance Y is a complex quantity $$Y=G+jB \qquad (1)$$

in which the real component G is conductance and the imaginary component B is susceptance. Complex admittance Y is the reciprocal of complex impedance $$Z=1/Y=R+jX \qquad (2)$$

The real component of Z is resistance R and the imaginary component is reactance X.

The Nyquist admittance plot of FIG. 7 is a plot of susceptance B versus conductance G with frequency as the common parameter. As shown in FIG. 7, the data curves proceed clockwise as frequency increases from 5 to 1000 Hz. Both the 14 experimental data points and the 14 data points calculated from the model of FIG. 6b are displayed in FIG. 7. Data at the three frequencies used to evaluate the model (5, 80, and 1000 Hz) are identified by circles. As expected, measured and calculated data agree exactly at these three frequencies. At all 11 of the other measurement frequencies, comparisons show that the measured and calculated data disagree slightly.

To more carefully compare measured and calculated data, I define the Percentage Y Deviation as follows:

$$\% \, Y \, \text{Deviation} = \frac{\{(G_{meas} - G_{calc})^2 + (B_{meas} - B_{calc})^2\}^{1/2}}{|Y|} \times 100 \qquad (3)$$

Figure 8:
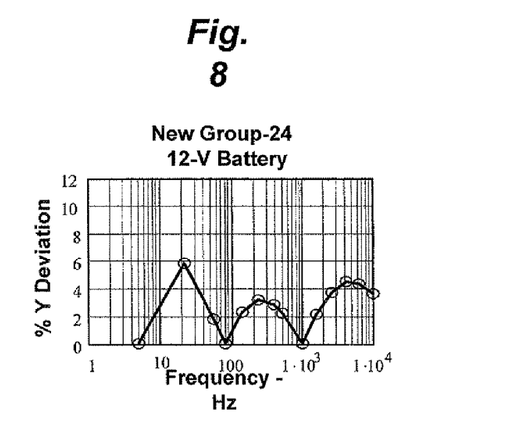
FIG. 8 is a plot of the percentage admittance deviation between measured and calculated values of FIG. 7.

A plot of % Y Deviation as a function of frequency at the 14 measurement frequencies is shown in FIG. 8. One sees that the % Y Deviation is zero at the three modeling frequencies, 5, 80, and 1000 Hz. At all 11 other frequencies, the % Y Deviation is positive and attains its maximum value of 5.9 at f=22 Hz. Note the lack of scatter in the data of FIG. 8. This is a strong indication of very high measurement precision.

Figure 9:
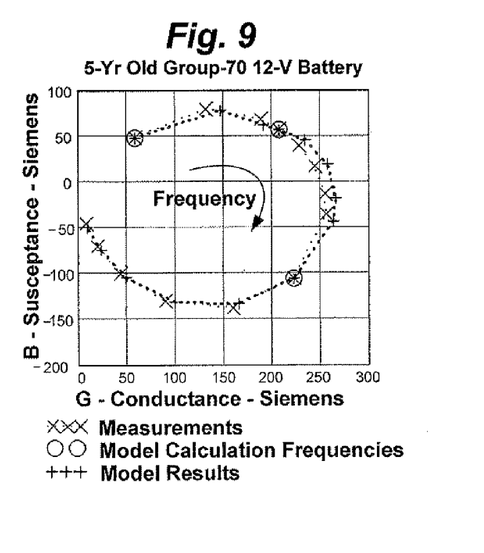
FIG. 9 is a Nyquist plot representation of the complex admittance of the fully-charged 5-year old Group-70 12-volt automotive battery. Both measured and model-derived admittance values are plotted. The circled data points identify the three frequencies (5, 80, 1000 Hz) used for model evaluation.

The apparatus of FIG. 5 was employed to measure the complex admittance of the 5-year old Group-70 battery at the same 14 discrete measurement frequencies (n+m=14) used previously. FIG. 9 is a Nyquist admittance plot displaying the results of those measurements. Again, the data curves proceed clockwise as frequency increases. Both the 14 experimental data points and the 14 data points calculated from the 6-element circuit model are displayed in FIG. 9. Again, data at the three frequencies used to evaluate the model (5, 80, and 1000 Hz) are identified by circles. Measured and calculated data again agree exactly at these three frequencies. At all 11 other frequencies, comparisons again show that measured and calculated data disagree. However, the disagreement is larger for the 5-year old Group-70 battery than that shown in FIG. 7 for the new Group-24 battery.

Figure 10:
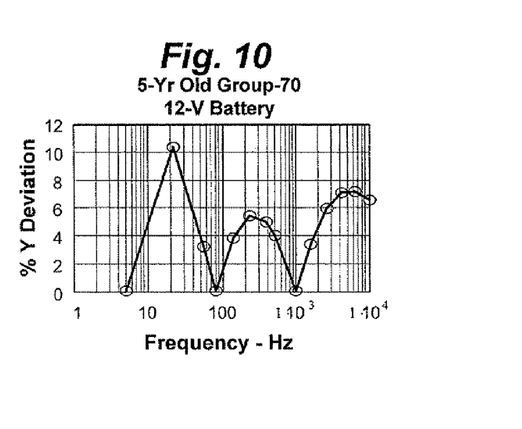
FIG. 10 is a plot of the percentage admittance deviation between measured and calculated values of FIG. 9.

FIG. 10 displays a plot of % Y Deviation for the 5-year old Group-70 battery at the 14 measurement frequencies displayed in FIG. 9. One again sees that the % Y Deviation is zero at the three modeling frequencies, 5, 80, and 1000 Hz. At all 11 other frequencies, the % Y Deviation is positive and attains its maximum value of 10.5 at f=22 Hz. Again note the complete lack of scatter in the data. This is again a strong indication of very high measurement precision.

By comparing FIGS. 8 and 10, one sees that an increase in cell deterioration is associated with increases in % Y Deviation at every one of the m=11 measurement frequencies not used in the model evaluation. Accordingly, values of % Y Deviation at selected frequencies can be advantageously utilized to identify and quantify the degree of cell deterioration in the battery—without requiring access to either cell electrolytes or cell voltages. One need only determine % Y Deviation at, say, one "extra" frequency (m=1) in order to apply this principle. For example, the % Y Deviation at 22 Hz could be used alone. This quantity is seen to be nearly twice as large (10.5) for the 5-year old battery having significant cell deterioration than for the brand-new battery (5.9) having very little cell deterioration. On the basis of this number, a pass/fail determination could be made without knowledge of the battery's manufacturer, group size, or electrical ratings.

This completes the disclosure of my invention. Although, for illustrative purposes, measurements on only two batteries have been disclosed above, one finds the results to be generally true across a wide spectrum of batteries. Measurements on other batteries from different manufacturers, of different group sizes, and having different electrical ratings have all corroborated the results described herein. That is one significant advantage of this technique. One need not know the battery's electrical ratings or even its group size or manufacturer in order to make a pass/fail determination based upon cell deterioration.

One also finds that other battery properties such a state-of-charge can be determined by measuring "Percentage Y Deviation" of batteries that are known to have little cell deterioration. Although the "Percentage Y Deviation" defined by equation (3) was introduced to mathematically compare measured and calculated admittance components, other mathematical methods and comparison quantities are possible. For example, one finds that the "Percentage Z deviation", defined in terms of measured and calculated Z components (R and X), gives identical results. Furthermore, one could make mathematical comparisons in other ways or by using any of the single immittance components R, X, G, or B. One could also use other battery models or other values of n and m. One finds that n=4 also works very well. Workers skilled in the art will recognize that these and other variations may be made in form and detail without departing from the true spirit and scope of my invention.

What is claimed is:

1. Apparatus for determining a physical property of an electrochemical cell or battery comprising:

immittance measuring circuitry coupled to said cell or battery with a pair of current-carrying contacts and a separate pair of voltage-sensing contacts and adapted to apply time-varying electrical excitation to said cell or battery with said pair of current-carrying contacts, to sense time-varying electrical response to said excitation with said pair of voltage-sensing contacts, and to utilize said excitation and said response to measure components of complex immittance at n discrete frequencies, where n is a finite integer equal to or greater than two but less than a maximum value;

computation circuitry responsive to said complex immittance components and adapted to evaluate elements of a 2n-element equivalent circuit model from said measured complex immittance components at said n discrete frequencies;

whereas said immittance measuring circuitry is further adapted to utilize said excitation and said response to measure components of complex immittance at m additional discrete frequencies where m is a finite integer equal to or greater than one but less than a maximum value, wherein said computation circuitry is not adapted to evaluate elements of the 2n-element equivalent circuit model from said measured complex immittance components at said m discrete frequencies; and, whereas said computation circuitry is further adapted to calculate complex immittance components of said 2n-element equivalent circuit model at said m additional discrete frequencies, and adapted to mathematically compare said calculated immittance components with said measured immittance components at said m additional discrete frequencies to obtain comparison results, said comparison results being related to said physical property.

2. The apparatus of claim 1 including display circuitry responsive to said computation circuitry and adapted to communicate results of said comparison to a user.

3. The apparatus of claim 2 wherein said results comprise a pass/fail determination.

4. The apparatus of claim 1 wherein said physical property is a degree of cell deterioration of said electrochemical cell or battery.

5. The apparatus of claim 1 wherein said physical property is state-of-charge of said electrochemical cell or battery.

6. The apparatus of claim 1 wherein n is equal to three and m is equal to one.

7. The apparatus of claim 1 wherein said complex immittance comprises complex admittance and said mathematical comparison comprises computing a percentage Y deviation between measured and calculated real and imaginary components of said complex admittance.

8. The apparatus of claim 1 wherein said complex immittance comprises complex impedance and said mathematical comparison comprises computing a percentage Z deviation between measured and calculated real and imaginary components of said complex impedance.

9. A method for determining a physical property of an electrochemical cell or battery comprising the steps of:

coupling immittance measuring circuitry to said cell or battery with a pair of current-carrying contacts and a separate pair of voltage-sensing contacts;

using said immittance measuring circuitry to measure complex immittance of said cell or battery at n discrete frequencies where n is a finite integer equal to or greater than two but less than a maximum value;

using computation circuitry to evaluate elements of a 2n-element equivalent circuit model from said complex immittance at said n discrete frequencies;

using said immittance measuring circuitry to measure complex immittance of said cell or battery at m additional discrete frequencies where m is a finite integer equal to or greater than one but less than a maximum value, wherein said computation circuitry is not adapted to evaluate elements of said 2n-element equivalent circuit model from said complex immittance at said m discrete frequencies;

using said computation circuitry to calculate complex immittance of said 2n-element equivalent circuit model at said m additional discrete frequencies;

using said computation circuitry to mathematically compare components of said calculated and said measured complex immittances at said m additional discrete frequencies; and, determining said physical property from the results of said comparison.

10. The method of claim 9 wherein said physical property is a degree of cell deterioration of said electrochemical cell or battery.

11. The method of claim 10 including communicating a pass/fail determination to a user based upon said degree of cell deterioration.

12. The method of claim 9 wherein said physical property is state-of-charge of said electrochemical cell or battery.

13. The method of claim 9 wherein n is equal to three and m is equal to one.

14. The method of claim 9 wherein said complex immittance comprises complex admittance and said mathematical comparison comprises computing a percentage Y deviation between measured and calculated real and imaginary components of said complex admittance.

15. The method of claim 9 wherein said complex immittance comprises complex impedance and said mathematical comparison comprises computing a percentage Z deviation between measured and calculated real and imaginary components of said complex impedance.

16. Apparatus for evaluating a degree of cell deterioration in an electrochemical cell or battery comprising:

immittance measuring circuitry coupled to said cell or battery with separate pairs of current carrying and voltage-sensing contacts and adapted to apply time-varying electrical excitation to said cell or battery and to sense a time-varying response, said excitation and response containing frequency components at n discrete frequencies where n is a finite integer equal to or greater than two but less than a maximum value and further adapted to measure complex immittance values at each of said n discrete frequencies;

computation circuitry responsive to said measured complex immittance values of said cell or battery at said n discrete frequencies and adapted to evaluate element values of a 2n-element equivalent circuit model of said cell or battery from said measured immittance values at said n discrete frequencies;

whereas said excitation and said response contain frequency components at m additional discrete frequencies, where m is a finite integer equal to or greater than one but less than a maximum value, and said immittance measuring circuitry is adapted to measure immittance components at each of said m additional discrete frequencies, wherein said computation circuitry is not adapted to evaluate element values of said 2n-element equivalent circuit model of said cell or battery from said measured immittance values at said m discrete frequencies; and, whereas said computation circuitry is further adapted to calculate complex immittance components of said 2n-element equivalent circuit model at said m additional discrete frequencies, and adapted to mathematically compare said calculated immittance components with said measured immittance components at said m additional discrete frequencies to obtain comparison results, said comparison results being related to said degree of cell deterioration.

17. The apparatus of claim 16 including display circuitry responsive to said computation circuitry and adapted to communicate said comparison results to a user.

18. The apparatus of claim 17 wherein said results comprises a pass/fail determination.

19. The apparatus of claim 16 wherein n is equal to three and m is equal to one.

20. The apparatus of claim 16 wherein said complex immittance comprises complex admittance and said mathematical comparison comprises computing a percentage Y deviation between measured and calculated real and imaginary components of said complex admittance.

21. The apparatus of claim 16 wherein said complex immittance comprises complex impedance and said mathematical comparison comprises computing a percentage Z deviation between measured and calculated real and imaginary components of said complex impedance.

22. A method for determining a degree of cell deterioration of an electrochemical cell or battery comprising the steps of:

coupling immittance measuring circuitry to said cell or battery with a pair of current-carrying contacts and a separate pair of voltage-sensing contacts;

using said immittance measuring circuitry to measure complex immittance of said cell or battery at n discrete frequencies where n is a finite integer equal to or greater than two but less than a maximum value;

using computation circuitry to evaluate elements of a 2n-element equivalent circuit model from said measured complex immittance at said n discrete frequencies;

using said immittance measuring circuitry to measure complex immittance of said cell or battery at m additional discrete frequencies where m is a finite integer equal to or greater than one but less than a maximum value, wherein said computation circuitry is not adapted to evaluate elements of said 2n-element equivalent circuit model from said measured complex immittance at said m discrete frequencies;

using said computation circuitry to calculate complex immittance of said 2n-element equivalent circuit model at said m additional discrete frequencies;

using said computation circuitry to mathematically compare components of said calculated complex immittance at said m additional discrete frequencies with said measured complex immittance at said m additional discrete frequencies to obtain a comparison result; and, determining said degree of cell deterioration from said comparison result.

23. The method of claim 22 wherein n is equal to three and m is equal to one.

24. The method of claim 22 wherein said complex immittance comprises complex admittance and said mathematical comparison comprises computing a percentage Y deviation between measured and calculated real and imaginary components of said complex admittance.

25. The method of claim 22 wherein said complex immittance comprises complex impedance and said mathematical comparison comprises computing a percentage Z deviation between measured and calculated real and imaginary components of said complex impedance.

26. The method of claim 22 including communicating a pass/fail determination to a user based upon said degree of cell deterioration.

\* \* \* \* \*